US012790196B2

(12) United States Patent
Pua et al.

(10) Patent No.: US 12,790,196 B2
(45) Date of Patent: Nov. 10, 2026

(54) MEMS SENSOR AND METHOD FOR FORMING THE SAME

(71) Applicant: AAC Technologies Pte. Ltd., Singapore (SG)

(72) Inventors: Zaixiang Pua, Singapore (SG); Veronica Tan, Singapore (SG); Kahkeen Lai, Singapore (SG); Houming Chong, Johor (MY); Zhan Zhan, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 611 days.

(21) Appl. No.: 18/323,380

(22) Filed: May 24, 2023

(65) Prior Publication Data

US 2024/0391756 A1 Nov. 28, 2024

(51) Int. Cl.
*B81B 3/00* (2006.01)
*B81C 1/00* (2006.01)

(52) U.S. Cl.
CPC ........ *B81B 3/0021* (2013.01); *B81C 1/00166* (2013.01); *B81B 2201/0257* (2013.01); *B81B 2203/0307* (2013.01); *B81B 2203/0315* (2013.01); *B81B 2203/04* (2013.01); *B81C 2201/0132* (2013.01); *B81C 2201/014* (2013.01)

(58) Field of Classification Search
CPC ................ B81B 3/0086; B81B 3/0059; B81B 2201/018; B81B 2201/047; B81B 2203/0109; B81B 2203/0181; B81B 2203/053; B81B 2203/055; B81B 2203/056; B81B 2203/058
See application file for complete search history.

(56) References Cited

U.S. PATENT DOCUMENTS

2006/0012343 A1* 1/2006 Gallant ................ B81B 3/0008 320/166
2009/0021884 A1* 1/2009 Nakamura ............ B81B 3/0059 359/224.1
2017/0074738 A1* 3/2017 Geisberger ............ G01L 9/0073
2022/0163558 A1* 5/2022 Nagata ................ G01P 15/0802
2023/0135941 A1* 5/2023 Gattere ................ B81B 3/0051 73/504.12
2023/0192475 A1* 6/2023 Deng .................... G01H 11/06 257/415

* cited by examiner

*Primary Examiner* — Moazzam Hossain
(74) *Attorney, Agent, or Firm* — Wiersch Law Group

(57) ABSTRACT

An MEMS sensor and a method therefor. The MEMS sensor includes a buried electrode layer; a top electrode layer spaced from the buried electrode layer, a cavity being formed between the buried electrode layer and the top electrode layer; and a device layer received the cavity. The device layer includes movable mass blocks spaced from one another, each of which is supported on the buried electrode layer through a respective anchor portion, a preset gap is formed between each movable mass block and the top electrode layer, and the preset gap formed by one of the movable mass blocks is different from the preset gap formed by another one of the movable mass blocks. This structure allows for greater flexibility in design and provides higher sensitivity and larger actuation force on the sensor, and die size reduction is achieved while achieving more complex designs with higher accuracy and miniaturization.

6 Claims, 4 Drawing Sheets

MEMS SENSOR AND METHOD FOR FORMING THE SAME

TECHNICAL FIELD

The present invention relates to the technical field of micro-electro mechanical systems, and in particular, to a MEMS sensor and a method for forming the MEMS sensor.

BACKGROUND

Many current designs for MEMS sensors, such as microphones, pressure sensors and inertial sensors, employ the use of a single device layer and one or more sacrificial layer which after release, will enable movement of the device layer. The single device layer design is nearing limitation in terms of performance, robustness, sensibility without increasing die size. Therefore, there is a rising demand for double or multi layered device structures.

In the related art, a possible process includes a multi epitaxial growth of polysilicon, while other processes such as chemical vapor deposition (CVD) and etching of silicon dioxide are used to achieve the double device layer. Following these conventional methods, there is a major cause for concern. However, the multi epitaxial growth of polysilicon requires a very high thermal budget and may cause unintended effects such as warpage.

SUMMARY

In an aspect, the present invention provides a micro-electro mechanical systems (MEMS) sensor, including: a buried electrode layer; a top electrode layer spaced apart from the buried electrode layer, a cavity being formed between the buried electrode layer and the top electrode layer; and a device layer received the cavity. The device layer includes movable mass blocks spaced apart from one another, each of the movable mass blocks is supported on the buried electrode layer through a respective anchor portion, a preset gap is formed between each of the movable mass blocks and the top electrode layer, and the preset gap formed by at least one of the movable mass blocks and the top electrode layer is different from the preset gap formed by another at least one of the movable mass blocks and the top electrode layer.

As an improvement, the movable mass blocks include a first movable mass block, a second movable mass block and a third movable mass block. The second movable mass block is located between the first movable mass block and the third movable mass block, a first preset gap is formed between the first movable mass block and the top electrode layer, a second preset gap is formed between the second movable mass block and the top electrode layer, and a third preset gap is formed between the third movable mass block and the top electrode layer. The first preset gap, the second preset gap and the third preset gap have different heights.

As an improvement, the height of the first preset gap, the height of the third preset gap and the height of the second preset gap increase in this sequence.

As an improvement, the height of the first preset gap is the same as the height of the third preset gap, and the height of the second preset gap is greater than the height of each of the first preset gap and the third preset gap.

As an improvement, one anchor portion is connected to a bottom of the first movable mass block, another one anchor portion is connected to a bottom of the third movable mass block, and another two anchor portions are connected to a bottom of the second movable mass block.

As an improvement, openings are formed in the top electrode layer, and the openings are spaced apart from one another along a radial direction of the top electrode layer.

In another aspect, the present invention provides a method for forming an MEMS sensor. The MEMS sensor includes: a buried electrode layer; a top electrode layer spaced apart from the buried electrode layer, a cavity being formed between the buried electrode layer and the top electrode layer; and a device layer received the cavity. The device layer includes movable mass blocks spaced apart from one another, each of the movable mass blocks is supported on the buried electrode layer through a respective anchor portion, a preset gap is formed between each of the movable mass blocks and the top electrode layer, and the preset gap formed by at least one of the movable mass blocks and the top electrode layer is different from the preset gap formed by another at least one of the movable mass blocks and the top electrode layer. The method includes: step S1, forming the buried electrode layer, a sacrificial layer, the device layer and the top electrode layer sequentially from bottom to top; step S2, etching the device layer to form the movable mass blocks spaced apart from one another; and step S3, releasing the sacrificial layer in the device layer.

As an improvement, the step S1 includes: step 101, forming the buried electrode layer; step 102, forming a sacrificial layer on the buried electrode layer, and etching a top surface of the sacrificial layer to form a stepped surface and recesses; step 103, forming the device layer on the sacrificial layer, the movable mass blocks of the device layer being stacked on the step surface, and the anchor portions of the device layer being formed in the recesses; and step 104, forming the top electrode layer, and forming openings in the top electrode layer.

As an improvement, in the step S2, the device layer is etched by a DRIE process to form the movable mass blocks spaced apart from one another.

As an improvement, the device layer is formed by a material selecting from one or more of lead zirconium titanate, aluminum nitride, barium titanate.

REFERENCE NUMERALS

Figure 1:
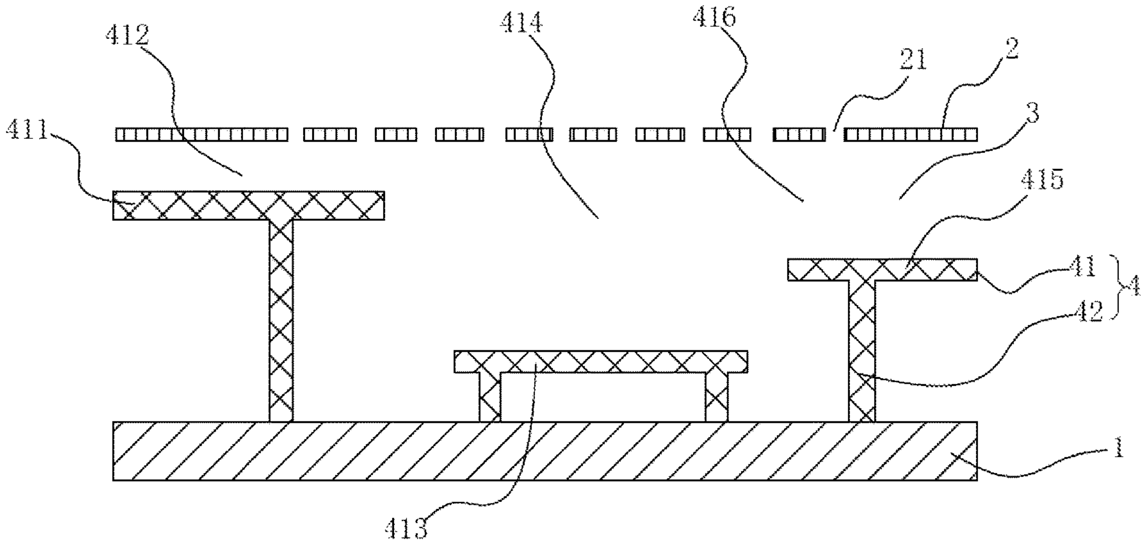
FIG. 1 is a schematic cross-sectional view of an MEMS sensor according to Embodiment I provided by the present invention.

- 1: buried electrode layer
- 2: top electrode layer
  - 21: opening
- 3: cavity
- 4: device layer
  - 41: movable mass block
    - 411: first movable mass block
    - 412: first preset gap 413: second movable mass block 414: second preset gap;

415: third movable mass block

416: third preset gap

42: anchor portion

5: sacrificial layer

51: recess

DESCRIPTION OF EMBODIMENTS

The embodiments described below by referring to the figures are exemplary merely for illustrating the present invention and should not be illustrated as limiting the present invention.

Figure 3:
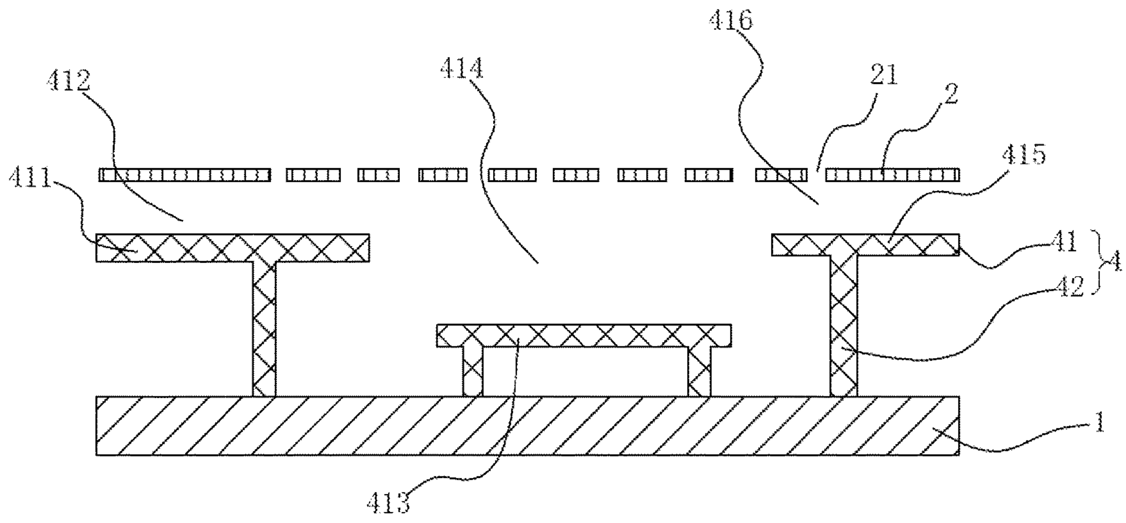
FIG. 3 is a schematic cross-sectional view of an MEMS sensor according to Embodiment II provided by the present invention.

As shown in FIG. 1 and FIG. 3, some embodiments of the present invention provide a micro-electro mechanical systems (MEMS) sensor, including: a buried electrode layer 1 and a top electrode layer 2 spaced apart from the buried electrode layer 1, and a device layer.

A cavity 3 is formed between the buried electrode layer 1 and the top electrode layer 2.

The device layer 4 is received in the cavity 3. At least a part of the device layer 4 is electric-conductive, so that a capacitor is formed by the device layer 4 and the top electrode layer 2 opposite to the device layer 4. In an example, when the MEMS sensor is used for a microphone, the top electrode layer 2 and device layer 4 are charged with opposite polarities when the microphone is powered on, thereby forming a capacitor. When the device layer 4 vibrates under an action of sound waves, a distance between the top electrode layer 2 and the device layer 4 changes, resulting in a change in the capacitance of the capacitor. Then, a sound wave signal is converted into an electrical signal, thereby realizing the corresponding function of the microphone.

In the embodiments of the present invention, the device layer 4 includes movable mass blocks 41 that are spaced apart from one another. The movable mass block 41 is supported on the buried electrode layer 1 through an anchor portion 42. A preset gap is formed between the movable mass block 41 and the top electrode layer 2. Different movable mass blocks 41 corresponds to different preset gaps, thereby forming differentially outputted electrical signals. Such a structure allows for greater flexibility in design and provides a higher sensitivity and larger actuation force on the sensors, and also die size reduction can also be achieved while also achieving more complex designs with higher accuracy and miniaturization. In an example, when the MEMS sensor is used for a microphone, the condenser microphone can have a higher signal-to-noise ratio, an improved ability in terms of suppressing linear distortion, and an improved ability in terms of anti-interference, so that the signal has a larger transmission distance and the microphone has a better audio performance.

Further, the movable mass blocks 41 include a first movable mass block 411, a second movable mass block 413 and a third movable mass block 415. The second movable mass block 413 is located between the first movable mass block 411 and the third movable mass block 415. A first preset gap 412 is formed between the first movable mass block 411 and the top electrode layer 2. A second preset gap 414 is formed between the second movable mass block 413 and the top electrode layer 2. A third preset gap 416 is formed between the third movable mass block 415 and the top electrode layer 2. The first preset gap 412, the second preset gap 414 and the third preset gap 416 have different heights.

A first capacitor is formed between the first movable mass block 411 and the top electrode layer 2. When the height of the first preset gap 412 formed between the first movable mass block 411 and the top electrode layer 2 changes, the capacitance of the first capacitor changes accordingly. A second capacitor is formed between the second movable mass block 413 and the top electrode layer 2. When the height of the second preset gap 414 formed between the second movable mass block 413 and the top electrode layer 2 changes, the capacitance of the second capacitor changes accordingly. A third capacitor is formed between the third movable mass block 415 and the top electrode layer 2. When the height of the third preset gap 416 formed between the third movable mass block 415 and the top electrode layer 2 changes, the capacitance of the third capacitor changes accordingly. The electrical signals outputted by the first capacitor, the second capacitor and the third capacitor form differentially outputted electrical signals, so that the sensor has a higher sensitivity.

Two embodiments are described in the following for illustrating the cases that the MEMS sensor provided by the present invention is used as a microphone. Those skilled in the art should know that, modifications can be made according to these embodiments, and all of these modifications shall belong to a scope of the present invention.

Embodiment I

With reference to FIG. 1, in this embodiment, the height of the first preset gap 412, the height of the third preset gap 416 and the height of the second preset gap 414 increase in this sequence. The capacitance of a capacitor is directly proportional to a facing area between the two electrode plates of the capacitor, and is inversely proportional to a distance between the two electrode plates of the capacitor, that is, $C=k\varepsilon_0\varepsilon_r S/d$, where k is a constant, $\varepsilon_0$ is a constant, and $\varepsilon_r$ is a constant, S denotes a facing area between the two electrode plates of the capacitor, and d is d denotes a distance between the two electrode plates of the capacitor. After the condenser microphone is formed, a value of $\varepsilon_0\varepsilon_r$ is determined. In a case where the first movable mass block 411, the second movable mass block 413 and the third movable mass block 415 have an approximately same area, the greater the height of the preset gap, the smaller the capacitance of the capacitor. In this embodiment, among the first capacitor formed by the first movable mass block 411, the second capacitor formed by the second movable mass block 413, and the third capacitor formed by the third movable mass block 415, an initial capacitance of the first capacitor formed by the first movable mass block 411 is the greatest, and an initial capacitance of the second capacitor formed by the second movable mass block 413 is the smallest. The second movable mass block 413 is located at the middle of the device layer 4 and deforms the most severely, thus providing higher sensitivity and larger actuation force.

In this embodiment, as shown in FIG. 1, one anchor portion 42 is provided at each of a bottom of the first movable mass block 411 and a bottom of the third movable mass block 415, and two anchor portions 42 are provided at a bottom of the second movable mass block 413. The first movable mass block 411, the second movable mass block 413, the third movable mass block 415 and the anchor portion 42 each can be formed by a conductive material.

Since the bottom of the second movable mass block 413 is supported by two anchor portions 42 spaced apart from each other, a movable part of the second movable mass block 413 is located between the two anchor portions 42. When the device layer 4 vibrates under an action of sound waves, the movable part of the second movable mass block 413 deforms, thereby changing a distance from the top electrode layer 2. As a result, the capacitance of the second capacitor changes accordingly, and differentially outputted electrical signals are formed among the first capacitor, the second capacitor and the third capacitor.

In an implementation manner, when the device layer 4 vibrates under an action of sound waves, each of the first movable mass block 411 and the third movable mass block 415 can pivot about the anchor portion 42, so that an end of each of the first movable mass block 411 and the third movable mass block 415 can be inclined upwards, while another end of each of the first movable mass block 411 and the third movable mass block 415 can be inclined downwards, thereby changing a distance from the top electrode layer 2. As a result, the capacitance of each of the first capacitor and the third capacitor changes accordingly, thus forming differentially outputted electrical signals.

In this embodiment, openings 21 are formed in the top electrode layer 2, and the openings 21 are spaced from one another along a radial direction of the top electrode layer 2. The openings 21 are evenly distributed to provide channels for the sound waves to pass through and provide structural support for the subsequent forming process.

Figure 2A:
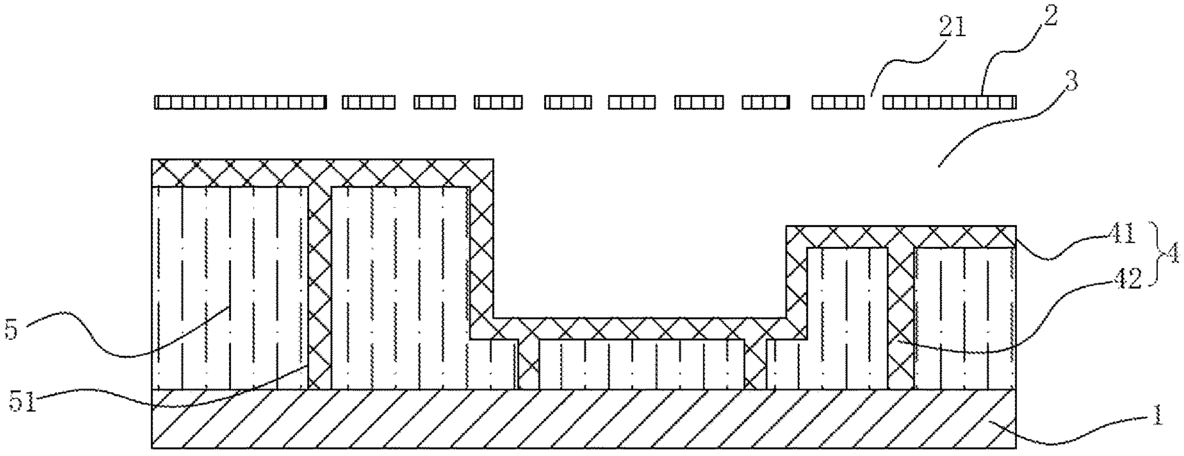
FIG. 2*a* to FIG. 2*c* illustrate a process flow for forming the MEMS sensor according to embodiment I provided by the present invention.
Figure 2B:
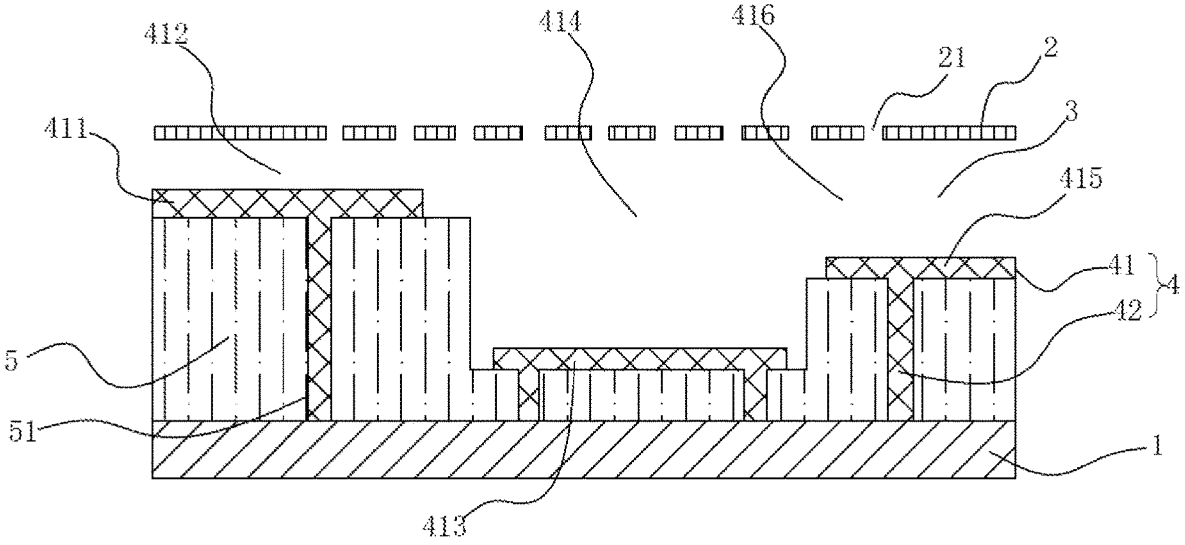
Figure 2C:
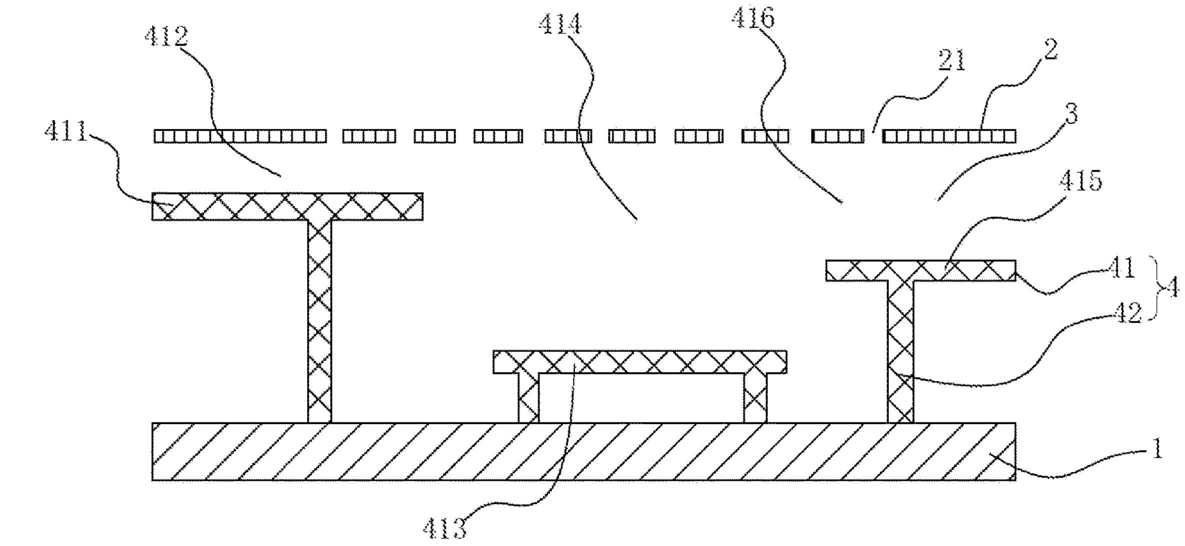

FIG. 2*a* to FIG. 2*c* illustrate a process flow for forming the MEMS sensor according to embodiment I provided by the present invention. The process for forming the MEMS sensor includes the following steps.

At step S1, as shown in FIG. 2*a*, the buried electrode layer 1, a sacrificial layer 5, the device layer 4, and the top electrode layer 2 are sequentially formed from bottom to top. In an implementation manner, step S1 includes the following steps.

At step 101, the buried electrode layer 1 is formed on a silicon substrate by electron beam lift-off or magnetron sputtering, and the buried electrode layer 1 is connected to a buried electrode pad (not shown) through a buried electrode lead (not shown). The buried electrode layer 1 is formed by a material selecting from one or more of Al, Mo, W, Pt, Cu, Ag, Au, ZrN, or another material with good electrical conductivity.

At step 102, a sacrificial layer 5 is formed on the buried electrode layer 1, and a top surface of the sacrificial layer 5 is etched to form a stepped surface and recesses 51. The sacrificial layer 5 can be formed by PSG, and a patterned hard mask is formed on the sacrificial layer 5. The recesses 51 are formed by etching the sacrificial layer 5 by dry etching or wet etching.

At step 103, the device layer 4 is formed on the sacrificial layer 5. The device layer 4 is formed by a material selecting from one or more of zirconium lead titanate, aluminum nitride, barium titanate. The movable mass block 41 of the device layer 4 is stacked on the stepped surface, thereby forming the device layer 4 having a height difference. The anchor portions 42 of the device layer 4 is formed in the recesses 51, filled in the recesses 51 until an electrical coupling is formed together with the buried electrode layer 1.

At step 104, the top electrode layer 2 is formed, and the top electrode layer 2 is connected to a top electrode pad (not shown) through a buried electrode lead (not shown). The top electrode layer 2 is formed by a material selecting from one or more of Al, Mo, W, Pt, Cu, Ag, Au, ZrN, or another material with good electrical conductivity. A patterned hard mask is formed on the top electrode layer 2, and the openings 21 are formed by etching the top electrode layer 2 by dry etching or wet etching.

At step S2, as shown in FIG. 2*b*, the device layer 4 is etched to form movable mass blocks 41 spaced apart from one another. In an implementation manner, the device layer 4 is etched by a deep reactive ion etching (DRIE) process. By using the DRIE process to form movable mass blocks with different heights, the device layer having different heights can be achieved, allowing greater design flexibility, and providing higher sensitivity and larger actuation force on the sensors and also die size reduction can also be achieved while also achieving more complex designs with higher accuracy and miniaturization. The same DRIE process step can also be used to do patterning for the device layer, while avoiding an increasing in the number of thermal cycles. With a device step height created due to DRIE, the gap between electrodes also can be altered, which is particularly useful for sensors which employ the parallel plates electrodes structure. The sacrificial layer 5 can also act as a hard mask and thus avoid etching the buried electrode layer 1 by the DRIE process.

In an implementation manner, the movable mass blocks 41 include a first movable mass block 411, a second movable mass block 413, and a third movable mass block 415. A first preset gap 412 is formed between the first movable mass block 411 and the top electrode layer 2. A second preset gap 414 is formed between the second movable mass block 413 and the top electrode layer 2. A third preset gap 416 is formed between the third movable mass block 415 and the top electrode layer 2. The height of the first preset gap 412, the height of the third preset gap 416 and the height of the second preset gap 414 increase in this sequence.

At step S3, as shown in FIG. 2*c*, the sacrificial layer 5 in the device layer 4 is released to allow the device layer 4 to move.

Embodiment II

With reference to FIG. 3, Embodiment II is different from Embodiment I in that a height of the first preset gap 412 is the same as a height of the third preset gap 416, and a height of the second preset gap 414 is greater than the height of each of the first preset gap 412 and the third preset gap 416. In this embodiment, an initial capacitance of the first capacitor formed by the first movable mass block 411 is greater, and an initial capacitance of the second capacitor formed by the second movable mass block 413 is smaller. The second movable mass block 413 is located at the middle of the device layer 4, and deforms the most severely, thus providing higher sensitivity and larger actuation force.

Figure 4A:
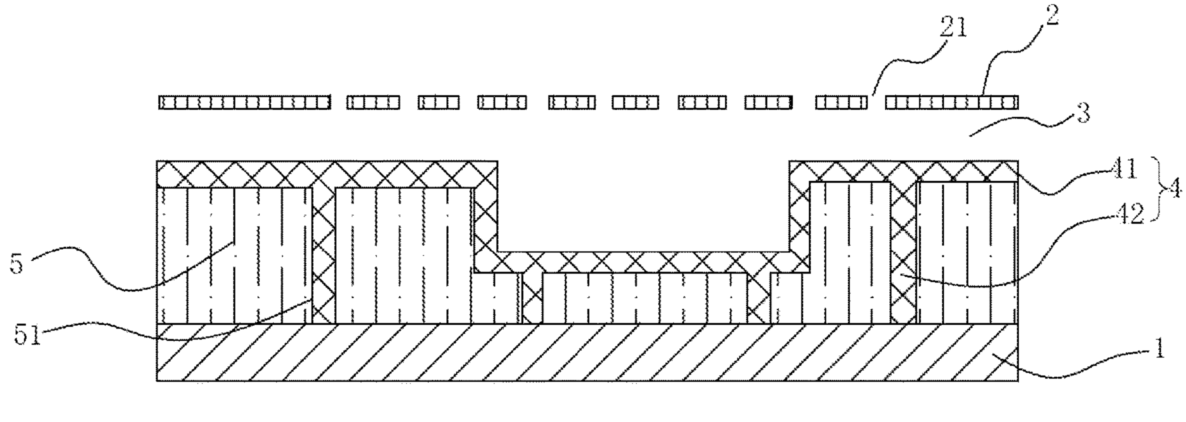
FIG. 4*a* to FIG. 4*c* illustrate a process flow for forming the MEMS sensor according to embodiment II provided by the present invention.
Figure 4B:
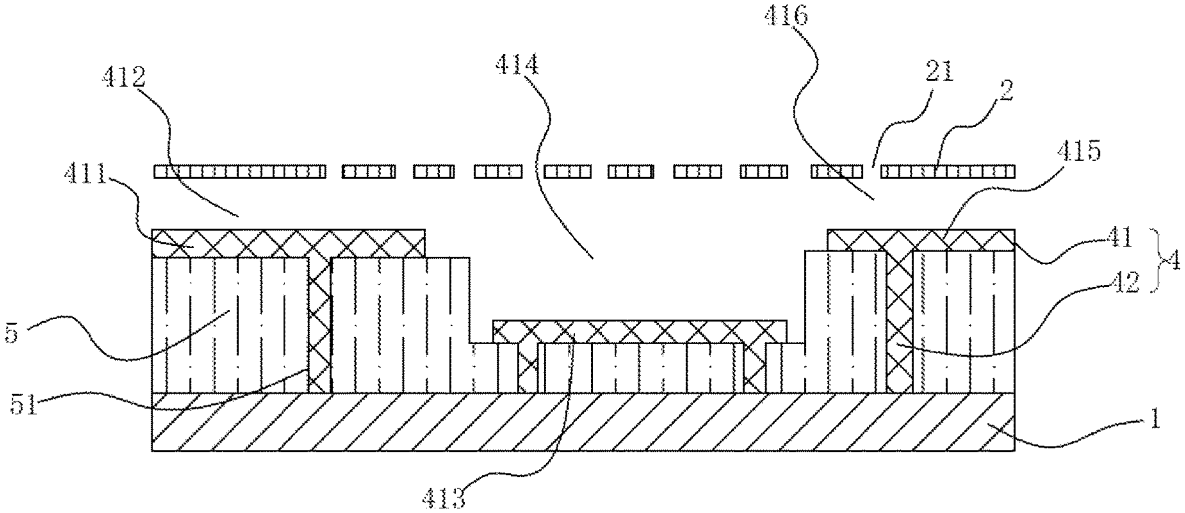
Figure 4C:
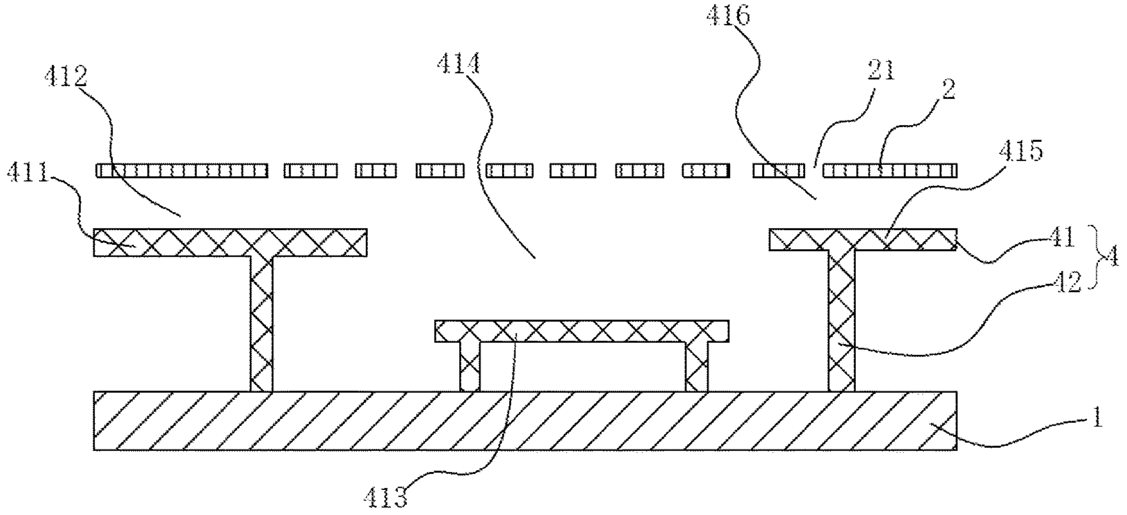

FIG. 4*a* to FIG. 4*c* illustrate a process flow for forming the MEMS sensor according to embodiment II provided by the present invention. The process for forming the MEMS sensor includes the following steps.

At step S1, as shown in FIG. 4*a*, the buried electrode layer 1, a sacrificial layer 5, the device layer 4, and the top electrode layer 2 are sequentially formed from bottom to top. In an implementation manner, step S1 includes the following steps.

At step 101, the buried electrode layer 1 is formed on a silicon substrate by electron beam lift-off or magnetron sputtering, and the buried electrode layer 1 is connected to a buried electrode pad (not shown) through a buried electrode lead (not shown). The buried electrode layer 1 is formed by a material selecting from one or more of Al, Mo, W, Pt, Cu, Ag, Au, ZrN, or another material with good electrical conductivity.

At step 102, a sacrificial layer 5 is formed on the buried electrode layer 1, and a top surface of the sacrificial layer 5 is etched to form a stepped surface and recesses 51. The sacrificial layer 5 can be formed by PSG, and a patterned hard mask is formed on the sacrificial layer 5. The recesses 51 are formed by etching the sacrificial layer 5 by dry etching or wet etching.

At step 103, the device layer 4 is formed on the sacrificial layer 5. The device layer 4 is formed by a material selecting from one or more of zirconium lead titanate, aluminum nitride, barium titanate. The movable mass block 41 of the device layer 4 is stacked on the stepped surface, thereby forming the device layer 4 having a height difference. The anchor portions 42 of the device layer 4 is formed in the recesses 51, filled in the recesses 51 until an electrical coupling is formed together with the buried electrode layer 1.

At step 104, the top electrode layer 2 is formed, and the top electrode layer 2 is connected to a top electrode pad (not shown) through a buried electrode lead (not shown). The top electrode layer 2 is formed by a material selecting from one or more of Al, Mo, W, Pt, Cu, Ag, Au, ZrN, or another material with good electrical conductivity. A patterned hard mask is formed on the top electrode layer 2, and the openings 21 are formed by etching the top electrode layer 2 by dry etching or wet etching.

At step S2, as shown in FIG. 2*b*, the device layer 4 is etched to form movable mass blocks 41 spaced apart from one another. In an implementation manner, the device layer 4 is etched by a deep reactive ion etching (DRIE) process. By using the DRIE process to form movable mass blocks with different heights, the device layer having different heights can be achieved, allowing greater design flexibility, and providing higher sensitivity and larger actuation force on the sensors and also die size reduction can also be achieved while also achieving more complex designs with higher accuracy and miniaturization. The same DRIE process step can also be used to do patterning for the device layer, while avoiding an increasing in the number of thermal cycles. With a device step height created due to DRIE, the gap between electrodes also can be altered, which is particularly useful for sensors which employ the parallel plates electrodes structure. The sacrificial layer 5 can also act as a hard mask and thus avoid etching the buried electrode layer 1 by the DRIE process.

In an implementation manner, the movable mass blocks 41 include a first movable mass block 411, a second movable mass block 413, and a third movable mass block 415. A first preset gap 412 is formed between the first movable mass block 411 and the top electrode layer 2. A second preset gap 414 is formed between the second movable mass block 413 and the top electrode layer 2. A third preset gap 416 is formed between the third movable mass block 415 and the top electrode layer 2. The height of the first preset gap 412 is the same as the height of the third preset gap 416, and the height of the second preset gap 414 is greater than the height of each of the first preset gap 412 and the third preset gap 416.

At step S3, as shown in FIG. 4*c*, the sacrificial layer 5 in the device layer 4 is released to allow the device layer 4 to move.

The structures, features and effects of the present invention have been described in detail above based on the embodiments shown in the drawings. It should be noted that the embodiments described above are merely preferred embodiments of the present invention, which do not limit a scope of the present invention. Any modifications, equivalent substitutions and improvements made within the principle of the present disclosure shall fall into the protection scope of the present disclosure.

What is claimed is:

1. A micro-electro mechanical systems (MEMS) sensor, comprising:

a buried electrode layer;

a top electrode layer spaced apart from the buried electrode layer, a cavity being formed between the buried electrode layer and the top electrode layer; and a device layer received the cavity, wherein the device layer comprises movable mass blocks spaced apart from one another, each of the movable mass blocks is supported on the buried electrode layer through a respective anchor portion, a preset gap is formed between each of the movable mass blocks and the top electrode layer, and the preset gap formed between at least one of the movable mass blocks and the top electrode layer is different from the preset gap formed between another at least one of the movable mass blocks and the top electrode layer, such that an initial capacitance formed between the top electrode layer and the at least one of the movable mass blocks is different from an initial capacitance formed between the top electrode layer and the another at least one of the movable mass blocks.

2. The MEMS sensor as described in claim 1, wherein the movable mass blocks comprise a first movable mass block, a second movable mass block and a third movable mass block; wherein the second movable mass block is located between the first movable mass block and the third movable mass block, a first preset gap is formed between the first movable mass block and the top electrode layer, a second preset gap is formed between the second movable mass block and the top electrode layer, and a third preset gap is formed between the third movable mass block and the top electrode layer; and wherein the first preset gap, the second preset gap and the third preset gap have different heights.

3. The MEMS sensor as described in claim 2, wherein the height of the first preset gap, the height of the third preset gap and the height of the second preset gap increase in this sequence.

4. The MEMS sensor as described in claim 2, wherein the height of the first preset gap is the same as the height of the third preset gap, and the height of the second preset gap is greater than the height of each of the first preset gap and the third preset gap.

5. The MEMS sensor as described in claim 2, wherein one anchor portion is connected to a bottom of the first movable mass block, another one anchor portion is connected to a bottom of the third movable mass block, and another two anchor portions are connected to a bottom of the second movable mass block.

6. The MEMS sensor as described in claim 1, wherein openings are formed in the top electrode layer, and the openings are spaced apart from one another along a radial direction of the top electrode layer.

* * * * *